(12) United States Patent
Murakami

(10) Patent No.: US 7,046,330 B2
(45) Date of Patent: May 16, 2006

(54) EXPOSURE APPARATUS

(75) Inventor: Eiichi Murakami, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/229,829

(22) Filed: Sep. 20, 2005

(65) Prior Publication Data

US 2006/0007416 A1    Jan. 12, 2006

Related U.S. Application Data

(62) Division of application No. 09/819,673, filed on Mar. 29, 2001, now Pat. No. 6,962,825.

(30) Foreign Application Priority Data

Mar. 30, 2000   (JP)   ............................. 2000-093449

(51) Int. Cl.
*G03B 27/52* (2006.01)
*G03B 27/42* (2006.01)

(52) U.S. Cl. .......................................... 355/30; 355/53
(58) Field of Classification Search .................. 355/30, 355/53–67; 250/548; 356/399–401; 438/5
See application file for complete search history.

(56) References Cited

U.S. PATENT DOCUMENTS

| 4,989,031 A | * | 1/1991 | Kamiya ........................ 355/30 |
| 5,137,349 A | | 8/1992 | Taniguchi et al. .......... 353/122 |
| 5,227,862 A | | 7/1993 | Oshida et al. ............... 356/363 |
| 5,329,354 A | | 7/1994 | Yamamoto et al. ......... 356/349 |
| 5,559,584 A | | 9/1996 | Miyaji et al. .................. 355/73 |
| 5,859,707 A | | 1/1999 | Nakagawa et al. .......... 356/401 |
| 6,330,065 B1 | | 12/2001 | Hill ............................. 356/485 |
| 6,341,006 B1 | | 1/2002 | Murayama et al. ........... 355/53 |
| 6,451,507 B1 | | 9/2002 | Suenaga et al. ............. 430/311 |
| 6,496,257 B1 | | 12/2002 | Taniguchi et al. ........ 356/239.2 |
| 6,507,388 B1 | | 1/2003 | Burghoorn .................... 355/53 |
| 6,522,384 B1 | | 2/2003 | Miwa ........................... 355/30 |
| 6,714,278 B1 | * | 3/2004 | Kamiya ........................ 355/30 |
| 6,753,942 B1 | * | 6/2004 | Nagahashi .................... 355/30 |
| 2001/0010579 A1 | | 8/2001 | Nishi ........................... 355/67 |
| 2001/0055100 A1 | | 12/2001 | Murakami .................... 355/53 |
| 2003/0095241 A1 | | 5/2003 | Burghoorn .................... 355/53 |

FOREIGN PATENT DOCUMENTS

JP    5-55114    3/1993
JP    7-29812    1/1995

* cited by examiner

Primary Examiner—Henry Hung Nguyen
(74) Attorney, Agent, or Firm—Fitzpatrick, Cella, Harper & Scinto

(57) ABSTRACT

An exposure apparatus for printing, by exposure, a pattern of an original onto a substrate includes a housing tightly filled with a predetermined ambience and for accommodating therein at least a portion of an exposure light optical axis, and a detection system having an optical system, wherein a portion of a light path of the detection system is disposed in a first space enclosed by the housing, and wherein at least another portion of the detection system including an electrical element thereof is disposed in a second space outside the housing.

3 Claims, 9 Drawing Sheets

EXPOSURE APPARATUS

This application is a divisional application of U.S. patent application Ser. No. 09/819,673, filed Mar. 29, 2001 now U.S. Pat. No. 6,962,825.

FIELD OF THE INVENTION AND RELATED ART

This invention relates to a semiconductor exposure apparatus and a device manufacturing method for manufacturing semiconductor devices by use of the same. In another aspect, the invention concerns a semiconductor manufacturing factory where such an exposure apparatus is provided, and a method of performing maintenance of the exposure apparatus. Particularly, the present invention is directed to an exposure apparatus which uses short wavelength laser light such as from a fluorine excimer laser, for example.

FIG. 1 is a sectional view schematically showing the structure of a conventional exposure apparatus. Denoted in the drawing at 1 is an illumination system for projecting exposure light, and denoted at 2 is a reticle having a pattern formed thereon. Denoted at 3 is a projection optical system for projecting the pattern of the reticle 2, and denoted at 4 is a wafer onto which the reticle pattern is to be transferred by exposure, through the projection optical system 3. Denoted at 5 is a wafer stage for moving the wafer 4 to adjust the position thereof. Denoted at 6 and 7 are a reticle space and a wafer space around a reticle stage and the wafer stage, respectively. In the wafer space 7, there are the wafer 4 and the wafer stage 5 as well as a detection system (focus system) 8–13 for detecting the wafer surface position, for example. Here, denoted at 8 is a measurement light source (LED), and denoted at 9 and 12 are a light projection side lens and a light receiving side lens, respectively, for adjusting the focus of the measurement light. Denoted at 10 and 11 are mirrors for adjusting the direction of the laser. In the exposure apparatus of the structure described above, the reticle space 6 and the wafer space 7 around the reticle stage and the wafer stage, respectively, are maintained at an atmospheric state, and detection systems (alignment and focus systems) are disposed in these spaces 6 and 7.

On the other hand, in recent semiconductor device manufacture, there is a growing tendency of using shorter wavelengths in the exposure light source of the exposure apparatus. This is because, by shortening the wavelength, the resolution of the projection exposure system used for the exposure is improved, such that a thinner pattern can be photoprinted. For example, since a fluorine excimer laser has a very short wavelength of 157 nm, the application of the same to exposure apparatuses has been attempted. The wavelength of 157 nm is in the wavelength region generally called vacuum ultraviolet. In such a wavelength region, absorption of light by oxygen molecules is large and, thus, the atmosphere transmits substantially no light. Therefore, it can be applied only in such an environment that the pressure is reduced nearly to vacuum and the oxygen concentration is kept sufficiently low. According to "Photochemistry of Small Molecules" by Hideo Okabe, A Wiley-Interscience Publication, 1978, page 178, the absorption coefficient of oxygen to light having a wavelength of 157 nm is about 190 $atm^{-1}cm^{-1}$. This means that, when light having a wavelength of 157 nm passes through a gas with an oxygen concentration 1% under an atmospheric pressure of one, the transmission factor T per 1 cm is only at the following level:

$$T=\exp(-190\times 1 \text{ cm}\times 0.01 \text{ atm})=0.150.$$

As described, in an exposure apparatus using short wavelength laser light such as from a fluorine excimer laser, since the absorption of light by oxygen is large, the oxygen concentration has to be reduced and the concentration has to be controlled strictly in order to assure a sufficient transmission factor.

In conventional exposure apparatuses, however, the spaces around the reticle stage and the wafer stage are kept in an atmospheric state. If, therefore, a short wavelength laser is used, there is a possibility that, due to absorption by oxygen in the atmosphere, a sufficient light quantity does not reach a wafer.

Further, when a fluorine excimer laser is used and in order that a practical exposure light irradiation amount is accomplished, the oxygen concentration along a light path should desirably be controlled to a level approximately not greater than 10 ppm. To this end, it is necessary to purge the space by use of an inactive gas such as nitrogen, for example. As regards the purging means, there may be (i) a method in which an inactive gas is continuously purged, (ii) a method in which the space is once evacuated to a vacuum to remove oxygen, for example, and, thereafter, it is purged, and so on. In any method, degassing from structural components of the exposure apparatus raises a problem. Particularly, it is very difficult to avoid oxygen from the component surface or from the clearance between adjacent components. It may be reduced by executing washing beforehand. However, a printed circuit board, for example, having electrical components cannot be washed. For these reasons, degassing occurs gradually during the purging process, which may cause contamination of the components.

SUMMARY OF THE INVENTION

It is accordingly an object of the present invention to provide an exposure apparatus and/or a device manufacturing method by which high resolution semiconductor devices can be produced efficiently by use of short wavelength exposure light.

It is another object of the present invention to provide a semiconductor manufacturing factory using such an exposure apparatus and/or a maintenance method for such an exposure apparatus.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Embodiment 1

Figure 1:
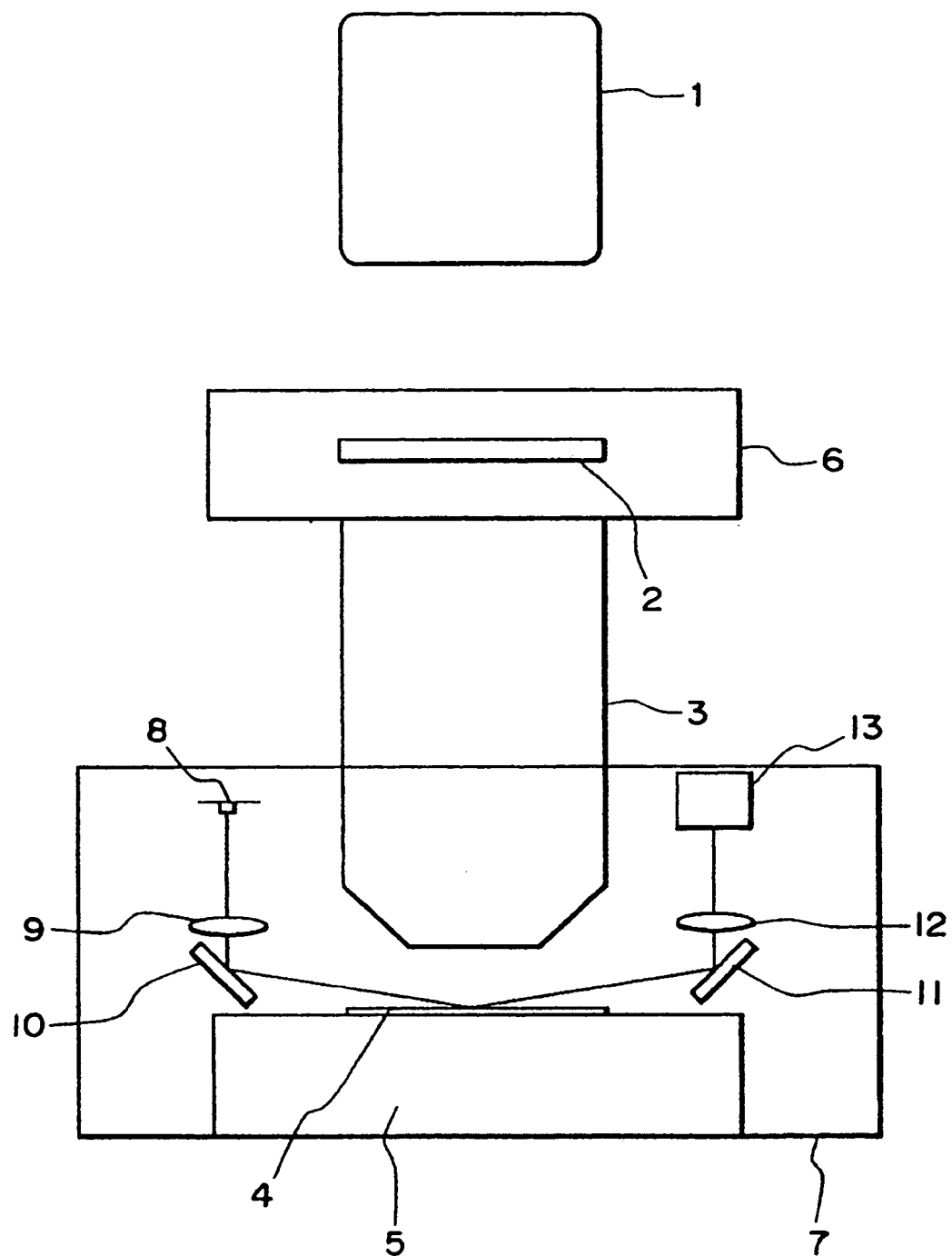
FIG. 1 is a schematic view of an example of a conventional exposure apparatus.
Figure 2:
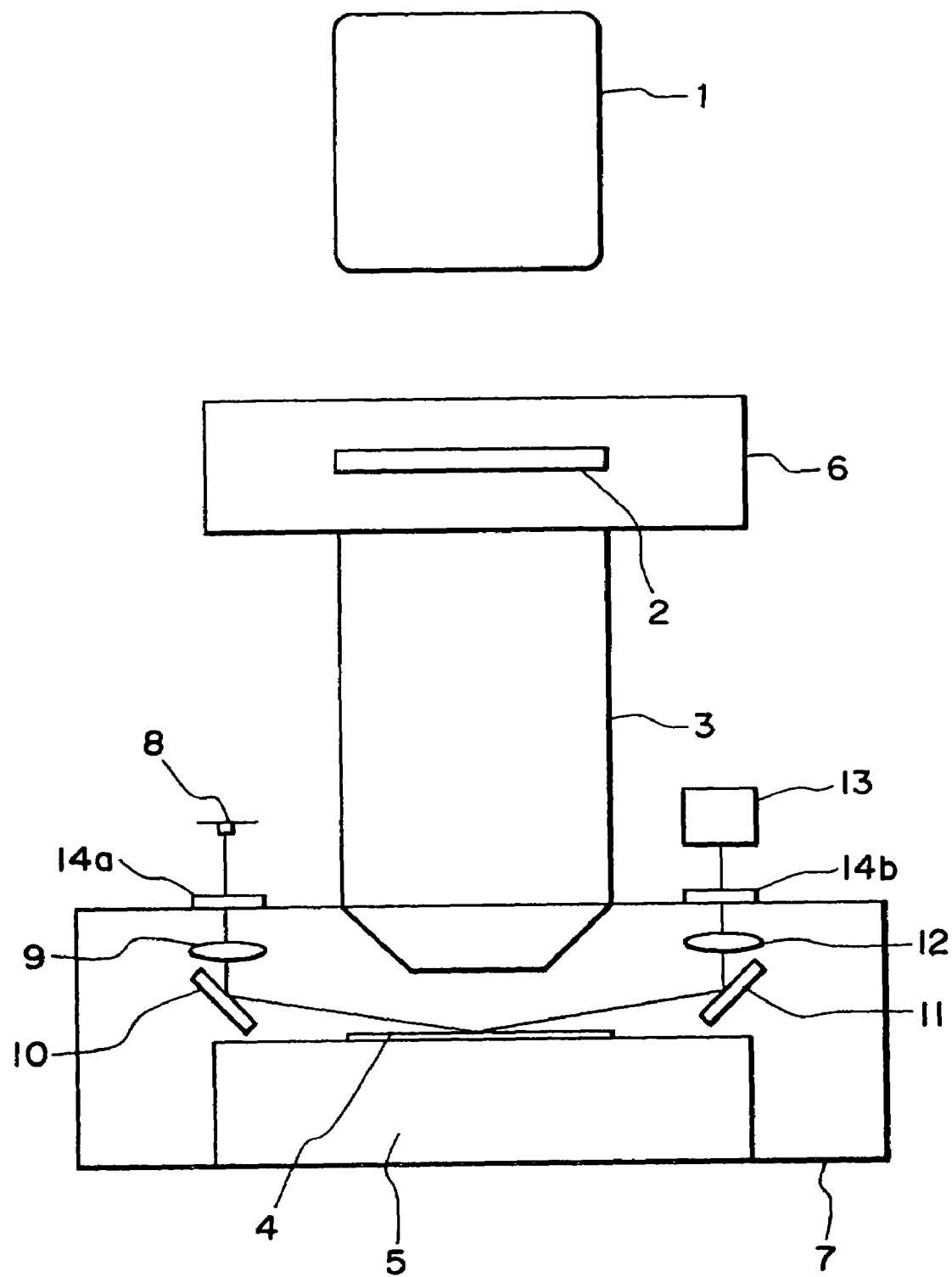
FIG. 2 is a schematic view of an exposure apparatus according to an embodiment of the present invention.

FIG. 2 is a sectional view for schematically showing an example of a semiconductor exposure apparatus, according to the present invention, which uses an $F_2$ excimer laser as a light source. In the drawing, reference numerals similar to those in FIG. 1 are assigned to corresponding elements.

In this embodiment, the wafer space 7 is isolated by a housing from the other portion. In this wafer space 7, lenses 9 and 12 and mirrors 10 and 11 of an autofocus system for detecting the wafer surface position are disposed. Focus detecting light (infrared LED having a wavelength $\lambda=780$ nm) emitted from a light source 8 is introduced into the wafer space 7 through a window 14a made of quartz. By way of the lens 9 and the mirror 10, the light is projected on the wafer 4. Then, by way of the mirror 11 and the lens 12 and through another window 14b made of quartz, the light is imaged upon the surface of a sensor (not shown) of a CCD detection system 13. In the wafer space 7, there are a gas inlet port and a vacuum applying suction port (not shown) such that a vacuum can be applied to the wafer space 7 by means of a vacuum pump connected to the suction port, and that a nitrogen gas can be introduced into the space thereafter from the gas inlet port to purge oxygen.

In accordance with this embodiment, by using a nitrogen gas, oxygen and moisture or water content in the space between the projection optical system 3 and the wafer 4 can be purged, and it assures an exposure process using short wavelength laser light without absorption of the exposure light by the ambient gas inside the wafer space 7. Further, since a vacuum is once applied to the wafer space 7, even if increases during loading or unloading of the wafer 4, it can be purged quickly. Also, in this embodiment, since a portion of the autofocus system for measuring the wafer surface position is disposed in a space separate from the wafer space 7, the purity of the inside gas of the wafer space 7 can be maintained at a high level. A portion of the autofocus system to be provided outside the wafer space 7 should desirably be the CCD detection system and the light source 8, for example, which include electrical components that are difficult to be washed. This arrangement effectively reduces degassing from electrical components and contamination due to it.

Although this embodiment uses a nitrogen gas as the purging gas, the invention is not limited to this. Any inactive gas may be used. For example, helium may be used as an inactive gas.

Further, a portion of the autofocus system being provided outside may be arranged to define a space separate from the wafer space 7, and such an outside space may be purged by a nitrogen gas, for example.

Embodiment 2

Figure 3:
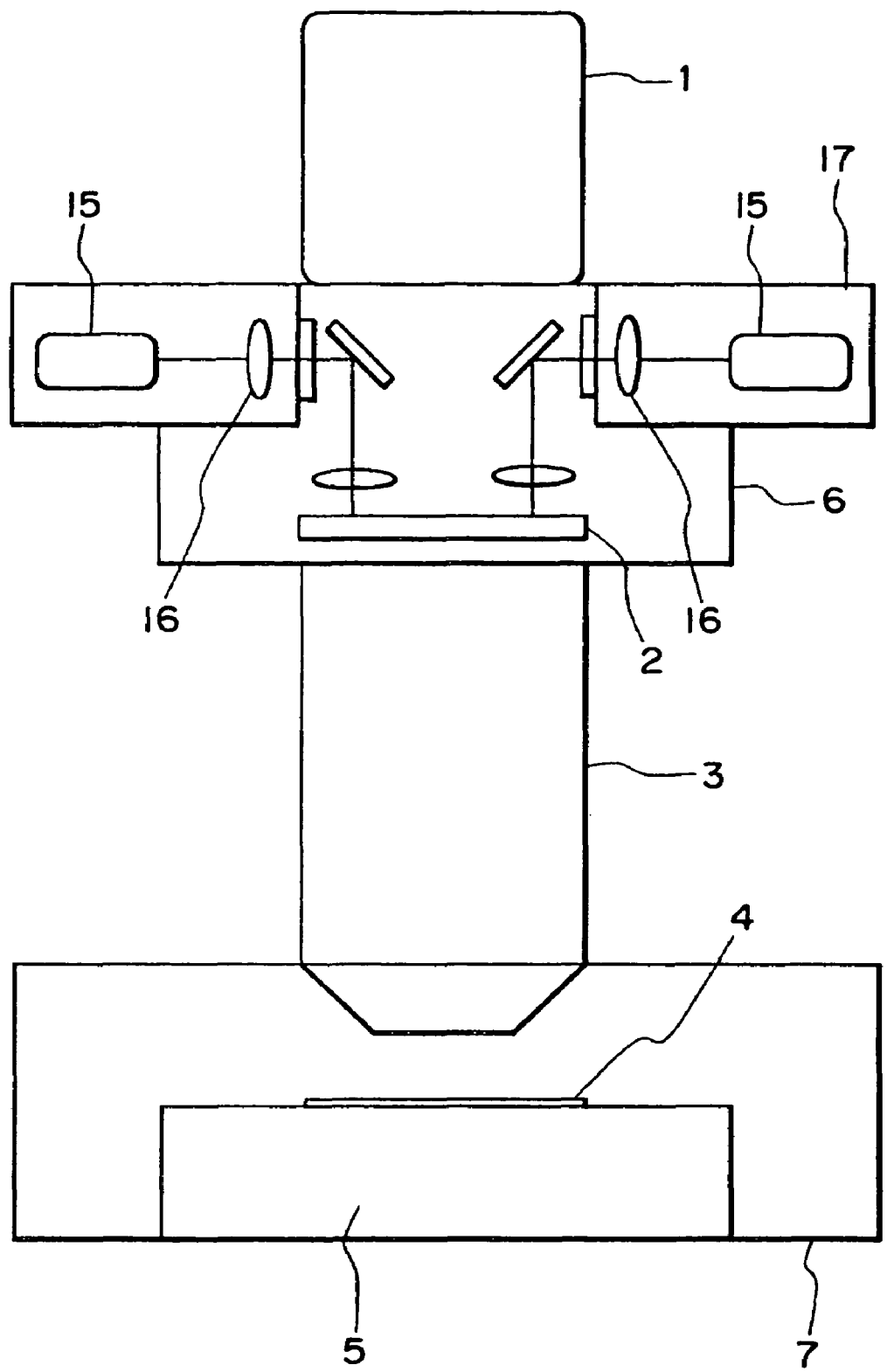
FIG. 3 is a schematic view of an exposure apparatus according to another embodiment of the present invention.

FIG. 3 is a sectional view schematically showing another embodiment of a semiconductor exposure apparatus of the present invention, which uses an $F_2$ excimer laser as a light source. In FIG. 3, reference numerals similar to those of FIG. 1 are assigned to corresponding elements.

In this embodiment, there is a TTL alignment detection system for performing wafer alignment through a reticle and a projection optical system. Measurement light therefor uses the exposure wavelength. The reticle space 6 and a detection system space 17 are isolated from the remaining portion by housings, respectively. Inside the reticle space 6, in addition to the reticle 2, there is a portion (e.g., a lens) of a detection optical system 16 for position detection. Inside the detection system space 17, in addition to the remaining portion of the detection optical system 16, there is a CCD detection system 15. In this embodiment, since exposure light is used also as the alignment detection light, the detection system space 17 and the reticle space 6 are isolated by use of a window material of $CaF_2$. The detection system space 17 is equipped with a gas inlet port (not shown), and the reticle space 6 is provided with a gas inlet port and a vacuum applying suction port (not shown). An inactive gas can be introduced through the gas inlet port, and oxygen can be purged by using nitrogen, for example. Particularly, a vacuum can be applied to the reticle space 7 by using a vacuum pump connected to the suction port, and thereafter, a nitrogen gas can be introduced through the gas inlet port to purge oxygen.

In accordance with this embodiment, by using a nitrogen gas, oxygen and moisture or water content in the space between the reticle 2 and the projection optical system 3 can be purged, and it assures an exposure process using short wavelength laser light without absorption of the exposure light by the ambient gas inside the reticle space 6. Further, since a vacuum is once applied to the reticle space 6, even if the oxygen concentration or water content level increases during loading or unloading of the reticle 2, it can be purged quickly. Also, in this embodiment, since a portion of the detection optical system 16 for the position detection is disposed in a space separate from the reticle space 6, the purity of the inside gas of the reticle space 6 can be maintained at a high level. A portion of the detection optical system 16 to be provided outside the reticle space 6 should desirably be the CCD detection system 15, for example, which includes electrical components that are difficult to be washed. This arrangement effectively reduces degassing from electrical components and contamination due to it. Further, since the CCD detection system 15 is disposed in the detection system space 17 isolated from the reticle space 6, there is no possibility of degassing from such electrical components or contamination due to it.

Since, in the detection system space 17, there is no necessity of loading or unloading a reticle, for example, a nitrogen gas may be injected continuously to keep the oxygen concentration or the water content at a low level.

Although this embodiment has been described with reference to a detection optical system of a TTL alignment system, the invention is not limited to this system. The invention is applicable also to a detection system for detecting the position of an optical axis of an illumination optical system, for example.

Embodiment 3

Figure 4:
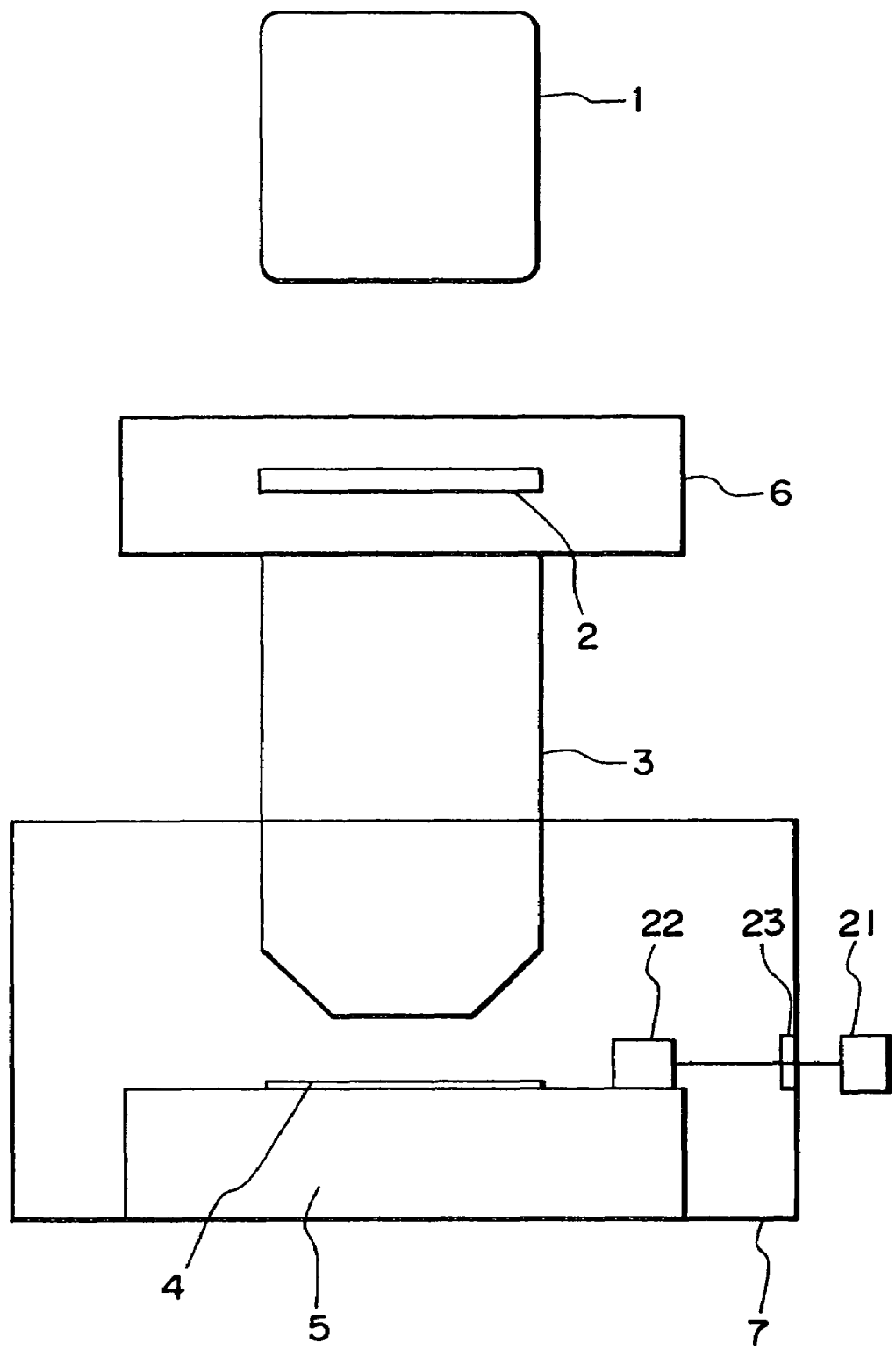
FIG. 4 is a schematic view of an exposure apparatus according to a further embodiment of the present invention.

FIG. 4 is a sectional view schematically showing another embodiment of a semiconductor exposure apparatus of the present invention, which uses an $F_2$ excimer laser as a light source. In FIG. 4, reference numerals similar to those of FIG. 1 are assigned to corresponding elements.

This embodiment concerns a laser interferometer as a position measuring system for measuring the position of a wafer.

In FIG. 4, the wafer 4 is held by a wafer chuck (not shown), which is mounted on a wafer stage 5. On the wafer stage 5, there is a mirror 22 for reflecting measurement light from a laser interferometer 21. The laser interferometer 21 is disposed in an outside space, which is isolated from the wafer space 7. A housing 7 for tightly closing the wafer space 7 is provided with a window 23 made of quartz, through which the measurement light from the laser interferometer 21 can be introduced into the wafer space 7.

As in the preceding embodiment, the wafer space 7 is provided with a gas inlet port and a vacuum applying suction port (not shown). A vacuum can be applied to the wafer space 7 by means of a vacuum pump connected to the suction port, and thereafter, a nitrogen gas can be introduced there from the inlet port, whereby oxygen in the housing 7 can be removed.

In accordance with this embodiment, by using a nitrogen gas, oxygen and moisture or water content in the space between the projection optical system 3 and the wafer 4 can be removed, and it assures an exposure process using short wavelength laser light without absorption of the exposure light by the ambient gas inside the wafer space 7. Further, since a vacuum is once applied to the wafer space 7, even if the oxygen concentration or water content level increases during loading or unloading of the wafer 4, it can be purged quickly. Also, in this embodiment, since a portion fo the position measuring system for measuring the position of the wafer (wafer stage) is disposed in a space separate from the wafer space 7, the purity of the inside gas of the wafer space 7 can be maintained at a high level. A portion of the position measuring system to be provided outside the wafer space 7 should desirably be the laser interferometer 21, for example, which includes electrical components that are difficult to be washed. This arrangement effectively reduces degassing from electrical components and contamination due to degassing. Further, by disposing a portion of the laser interferometer separately, a position measurement error resulting from the state inside the space (e.g., fluctuation) can be reduced.

Further, as in the preceding embodiment, the outside laser interferometer, which is isolated from the wafer space may be tightly enclosed and a nitrogen gas, for example, may be injected continuously into such a closed detection system space. This effectively keeps the oxygen concentration or the water content at a low level.

Although this embodiment has been described with reference to a position measuring system having a mirror mounted on a wafer stage to measure the position of a wafer (wafer stage), the embodiment is not limited to it, as long as a laser interferometer is used. For example, the invention is applicable also to a position measuring system having a mirror mounted on a reticle stage to measure the position of a reticle (reticle stage).

Further, the structures of the preceding embodiments maybe combined partially or totally.

[Embodiments of Semiconductor Manufacturing System]

Next, an embodiment of a manufacturing system for manufacturing semiconductor devices such as semiconductor chips (e.g., ICs or LSIs), liquid crystal panels, CCDs, thin film magnetic heads, or micro-machines, for example, will be described. This system is arranged so that repair of any disorder occurring in a production machine in a semiconductor manufacturing factory or periodic maintenance thereof or, alternatively, maintenance service such as software supply can be made by use of a computer network outside the manufacturing factory.

Figure 5:
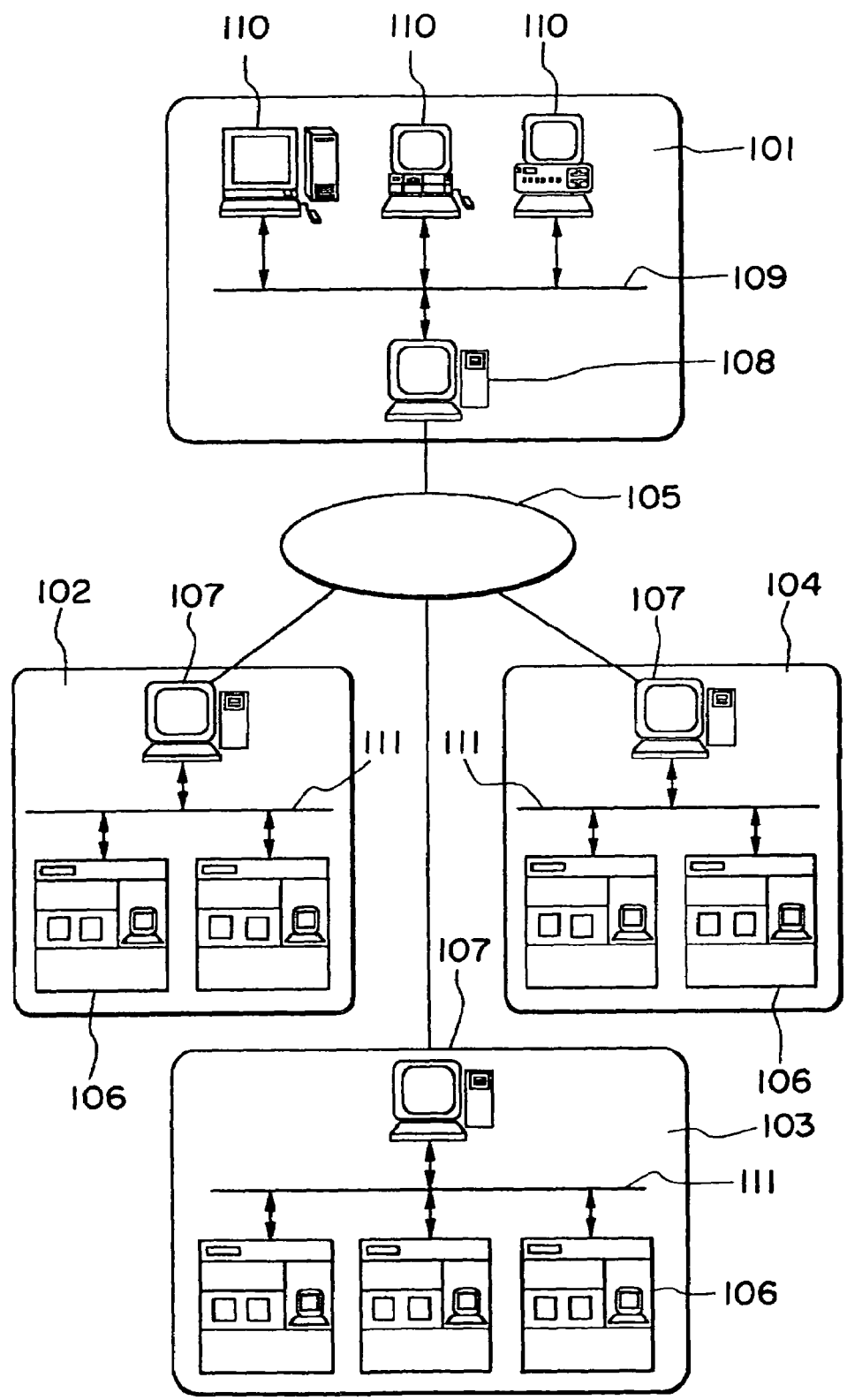
FIG. 5 is a schematic view of a semiconductor device manufacturing system in an aspect thereof.

FIG. 5 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (various lithographic apparatuses such as exposure apparatuses, resist coating apparatus, etching apparatuses, for example, and heat treatment apparatuses, film forming apparatuses, and flattening apparatuses) and post-process machines (assembling machines or inspection machines, for example) are expected. Inside the business office 101, there are a host control system 108 for providing a maintenance database for the production machines, plural operating terminal computers 110, and a local area network (LAN) 109 for connecting these computers to constitute an intranet. The host control system 108 is provided with a gateway for connecting the LAN 109 to an internet 105, which is an outside network of the office, and a security function for restricting the access from the outside.

On the other hand, denoted at 102–104 are manufacturing factories of a semiconductor manufacturer or manufacturers as a user (users) of production machines. The factories 102–104 may be those belonging to different manufacturers or the same manufacturer (e.g., pre-process factory and post-process factory). In each of the factories 101–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105, which is an outside network of the factory. With this structure, the host control system 108 of the vendor 101 can be accessed from the LAN 111 in each factory, through the Internet 105. Through the security function of the host control system 108, only admitted users can gain access thereto. More specifically, through the internet 105, status information representing the state of operation of the production machines 106 (for example, the state of the machine in which any disorder has occurred) may be transmitted as a notice from the factory to the vendor. Additionally, response information responsive to the notice (for example, information on how the disorder should be treated or software data concerning the treatment) as well as latest software and maintenance information such as help information may be supplied from the vendor. The data communication between each factory 102–104 and the vendor 101 as well as the data communication through the LAN 111 in each factory may use a communication protocol (TCP/IP) generally used in the internet. In place of using the internet, an exclusive line network (e.g., ISDN) having higher security in which no third party can access, may be used. Further the host control system is not limited to the system as provided by the vendor. A database may be structured by the user and set in an outside network, such that it can be accessed from plural user factories.

Figure 6:
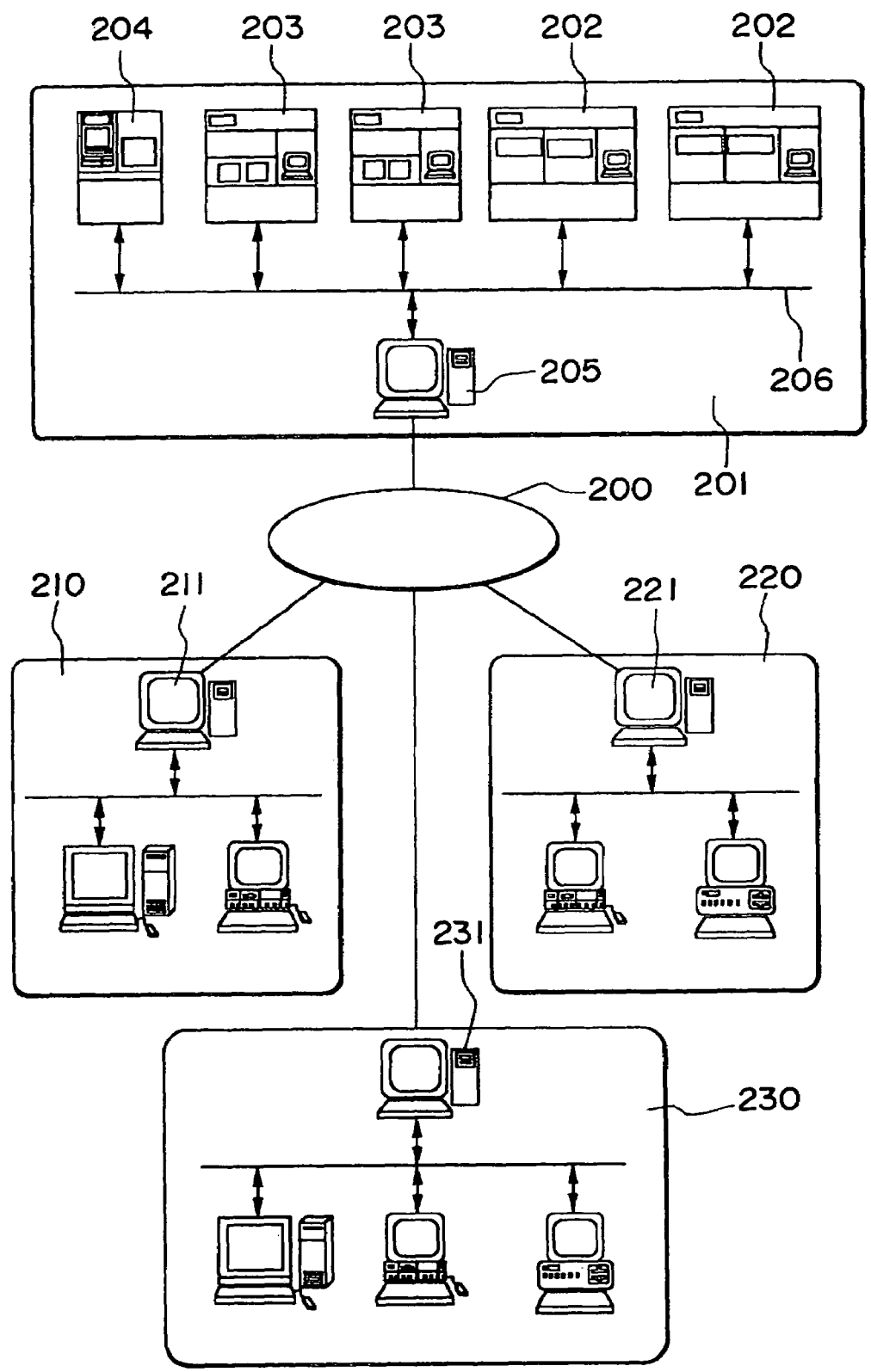
FIG. 6 is a schematic view of a semiconductor device manufacturing system in another aspect thereof.

FIG. 6 is a schematic view of the general structure of the production system according to this embodiment, in another aspect thereof different from FIG. 5. In the preceding example, plural user factories each having production machines and the control system of the vendor of the production machine are connected through an external network, so that through this external network, information related to the production control in each factory or related to at least one production machine is data communicated. In this example, as compared therewith, a factory having production machines from different vendors and control systems of the vendors corresponding to the user production machines are connected with each other through an external network outside the factory, so that maintenance information for these production machines is data communicated.

Denoted in the drawing at 201 is a manufacturing factory of a production machines user (e.g., a semiconductor device manufacturer). Along the production line in the factory, there are many production machines for performing various processes, that is, in this example, exposure apparatus 201, resist processing apparatus 203, and film formation processing apparatus 204 introduced. Although in the drawing only one factory is illustrated, in practice, plural factories may be arranged into the network. Each production machine in the factory is connected through a LAN 206 to constitute an intranet. The operation of the production line is controlled by a host control system 205.

On the other hand, in the business offices of vendors (e.g., a machine supplying maker) such as an exposure apparatus manufacturer 210, a resist processing machine manufacturer 220, and a film forming machine manufacturer 230, for example, there are host control system 211, 221 and 231 for performing remote control maintenance of the machines supplied by them. Each of these host control system is equipped with a maintenance database and a gateway for the outside network. The host control system 205 for controlling machines in the user factory and the control systems 211, 221 and 231 of the machine vendors are connected with each other through the external network 200 (internet) or an exclusive line network. If, in this production system, a disorder occurs in any one of the production machines in the production line, the operation of the production machine is stopped. However, this can be met quickly through the remote control maintenance of the disordered machine from the machine vendor by way of the internet 200. Therefore, the suspension of the production line can be made minimum.

Figure 7:
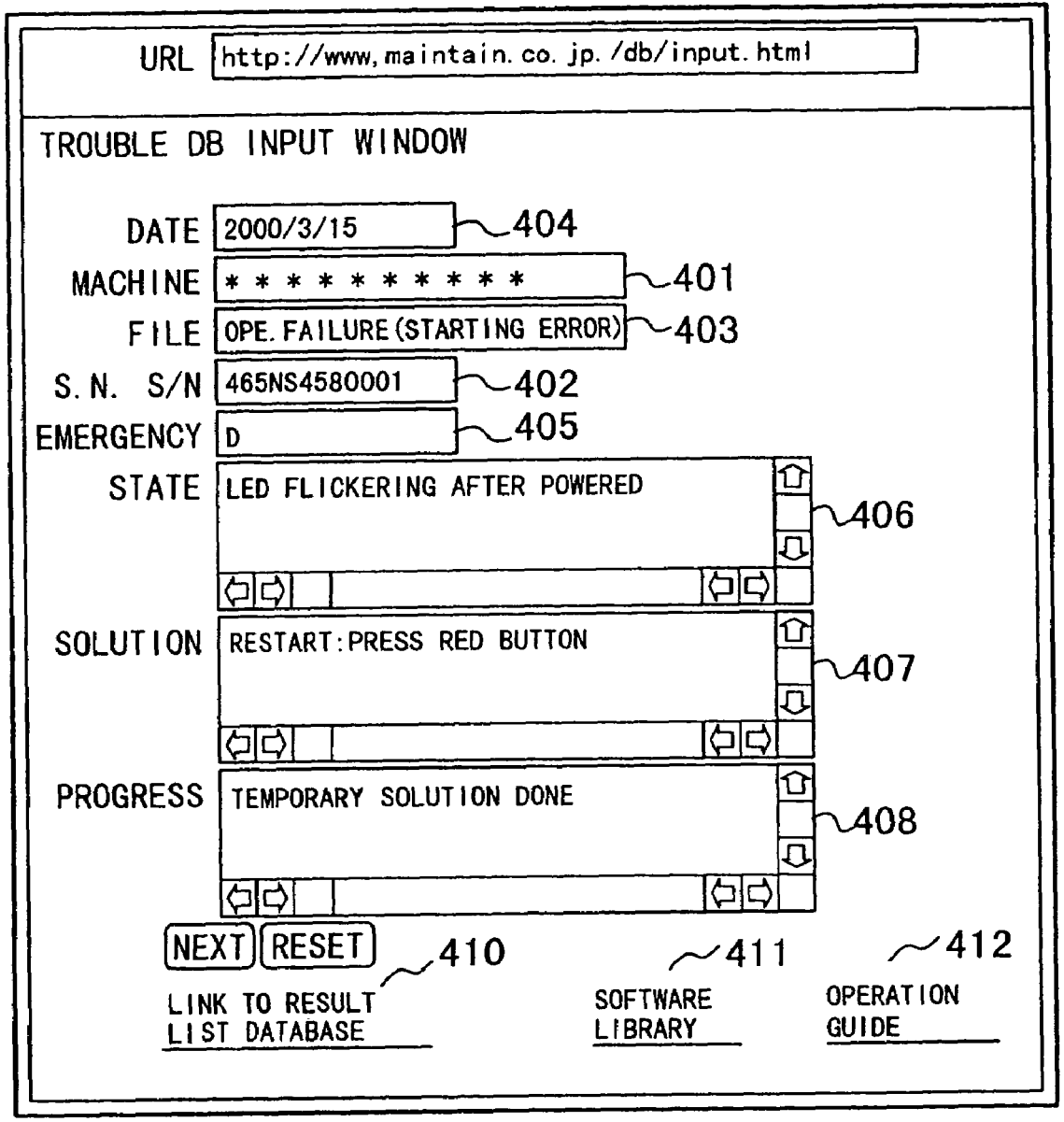
FIG. 7 is a schematic view of a specific example of a user interface.

Each of the production machines in the factory may have a display, a network interface and a computer for executing network accessing software stored in a storage device as well as machine operating software. The storage device may be a memory or a hard disk or, alternatively, a network file server. The network accessing software may include an exclusive or wide-use web browser, and a user screen interface such as shown in FIG. 7, for example, is provided on the display. Various information may be inputted into the computer (input items on the screen) by an operator or operators who control the production machines in the factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user display. Further, the user interface as provided by the web browser enables a hyperlink function (410–412) as illustrated. As a result, the operator can access further details of information in each of the items, can get latest version software to be used for the production machine, from the software library provided by the vendor, or can get an operation guide (help information) for the factory operators.

Next, a semiconductor device manufacturing process, which uses the production system described above, will be explained.

Figure 8:
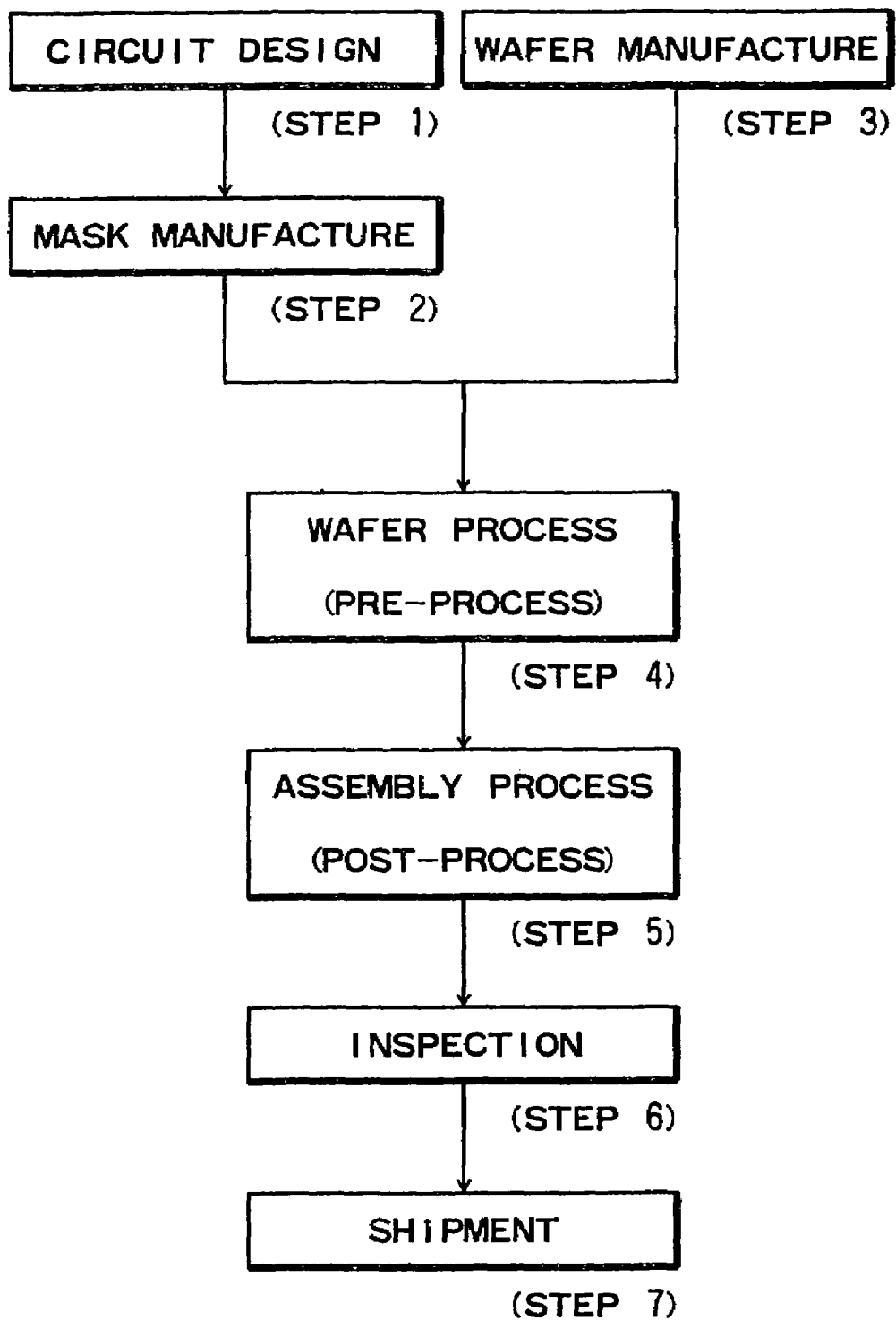
FIG. 8 is a flow chart of device manufacturing processes.

FIG. 8 is a flow chart of a general procedure for manufacturing semiconductor devices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication of information related to the production control and machine maintenance may be done through the internet or an exclusive line network.

Figure 9:
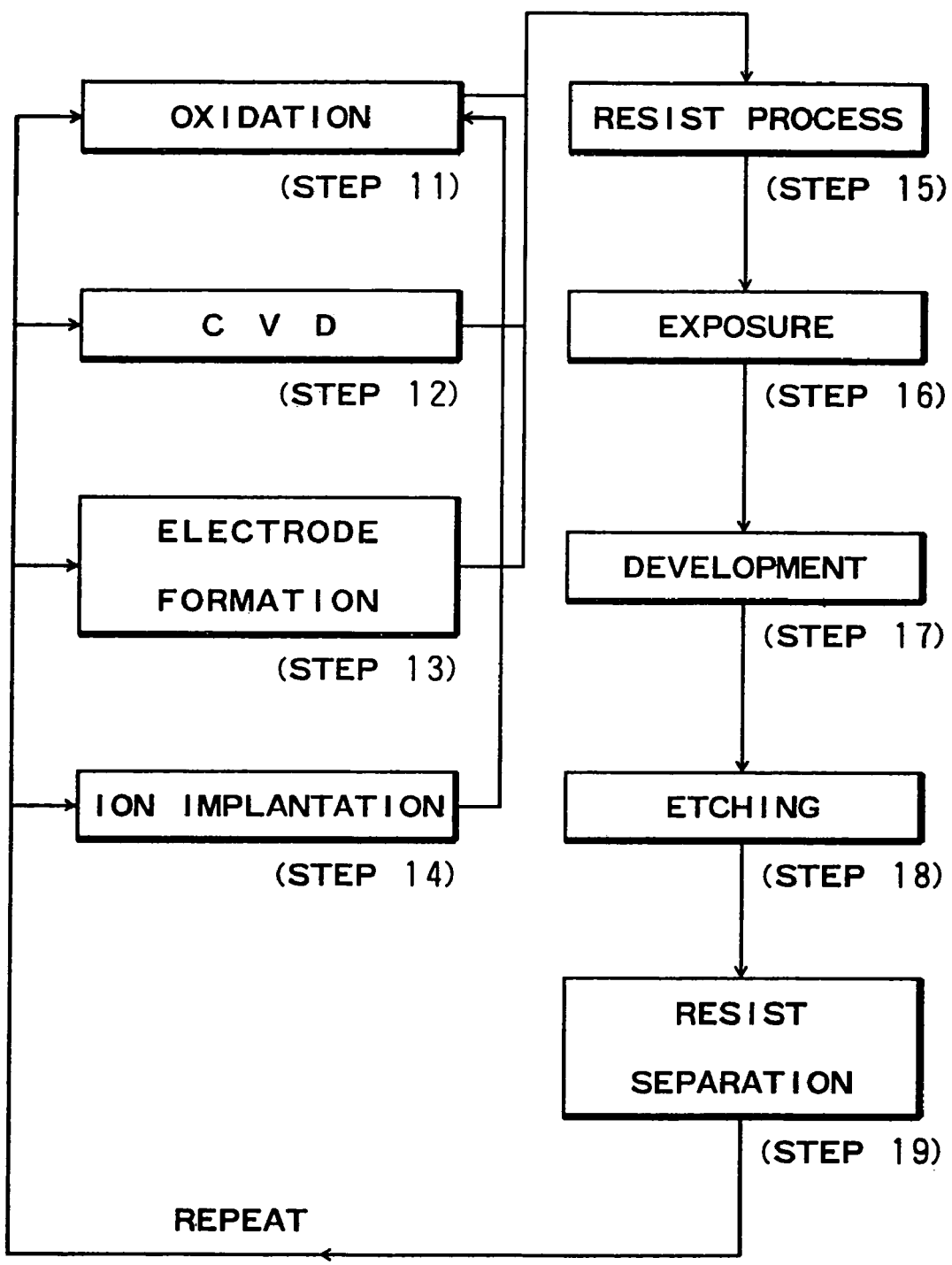
FIG. 9 is a flow chart for explaining details of a wafer process in the procedure of the flow chart of FIG. 8.

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, disorders may be prevented beforehand. If there occurs a disorder, it can be met quickly. Therefore, the device productivity can be improved significantly.

In accordance with the embodiments described hereinbefore, degassing from a detection system can be reduced, and degradation of the transmission factory of an optical system such as a projection lens or a detection system can be prevented effectively. Further, the need for taking some measures for providing a vacuum in an electrical system can be removed.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate to a pattern of an original, said apparatus comprising:

a projection optical system that projects the pattern of the original onto the substrate;

a housing tightly filled with a predetermined ambience, wherein said housing houses therein at least a portion between said projection optical system and the substrate; and a detection system that detects a surface position of the substrate and includes (i) a light source, (ii) a detector and (iii) a directing optical system that directs light from said light source to said detector, wherein a portion of a light path of said directing optical system is disposed in a first space enclosed by said housing, and wherein said light source and said detector are disposed in a second space outside said housing.

2. An apparatus according to claim 1, wherein said detector comprises a CCD.

3. A device manufacturing method, comprising the steps of:

exposing a substrate by use of an exposure apparatus as recited in claim 1; and developing the exposed substrate.

* * * * *